(12) United States Patent
Sonobe et al.

(10) Patent No.: US 6,176,709 B1
(45) Date of Patent: Jan. 23, 2001

(54) SOCKET AND ADAPTER INTEGRATED CIRCUIT, AND INTEGRATED CIRCUIT ASSEMBLY

(75) Inventors: Yoshiiku Sonobe; Makoto Oya, both of Nagoya; Satoru Watanabe, Hyogo; Osamu Nishida, Osaka, all of (JP)

(73) Assignees: Melco Inc; Japan Solderless Terminal Mfg. Co., LTD, both of (JP)

( * ) Notice: Under 35 U.S.C. 154(b), the term of this patent shall be extended for 0 days.

(21) Appl. No.: 09/472,518

(22) Filed: Dec. 27, 1999

(30) Foreign Application Priority Data

Dec. 28, 1998 (JP) .................................................. 10-374301

(51) Int. Cl.$^7$ ...................................................... H01R 9/09
(52) U.S. Cl. ........................................................ 439/69
(58) Field of Search .................................... 361/784, 785, 361/791, 792; 439/83, 69, 70, 71, 72

(56) References Cited

U.S. PATENT DOCUMENTS

| 4,082,394 | * | 4/1978 | Gedney et al. | 439/69 |
| 5,973,924 | * | 10/1999 | Gillespie, Jr. | 361/735 |
| 5,982,635 | * | 11/1999 | Menzies et al. | 361/790 |

FOREIGN PATENT DOCUMENTS

| 5-265022 | 10/1993 | (JP) . |
| 6-045484 | 2/1994 | (JP) . |
| 8-078809 | 3/1996 | (JP) . |
| 9-160674 | 6/1997 | (JP) . |
| 3042946 | 8/1997 | (JP) . |
| 10-107073 | 4/1998 | (JP) . |
| 10-199639 | 7/1998 | (JP) . |

* cited by examiner

Primary Examiner—Brian Sircus
Assistant Examiner—Son V. Nguyen
(74) Attorney, Agent, or Firm—Rader, Fishman & Grauer

(57) ABSTRACT

A socket for an integrated circuit which is used for attaching the integrated circuit to a socket mounted on a primary wiring board with an intermediate wiring board interposed therebetween, an adapter for an integrated circuit utilizing the integrated circuit socket, and an integrated circuit assembly utilizing the integrated circuit adapter. The integrated circuit socket includes: a housing to be directly fitted with the integrated circuit; a long insertion pin which is to be inserted through the intermediate wiring board and to be fitted in the socket of the primary wiring board; a short insertion pin which is to be inserted through the intermediate wiring board but not to reach the socket of the primary wiring board; and a surface-mount pin which is to be connected to a surface of the intermediate wiring board opposed to the housing; the long insertion pin, the short insertion pin and the surface-mount pin being implanted in the housing.

13 Claims, 12 Drawing Sheets

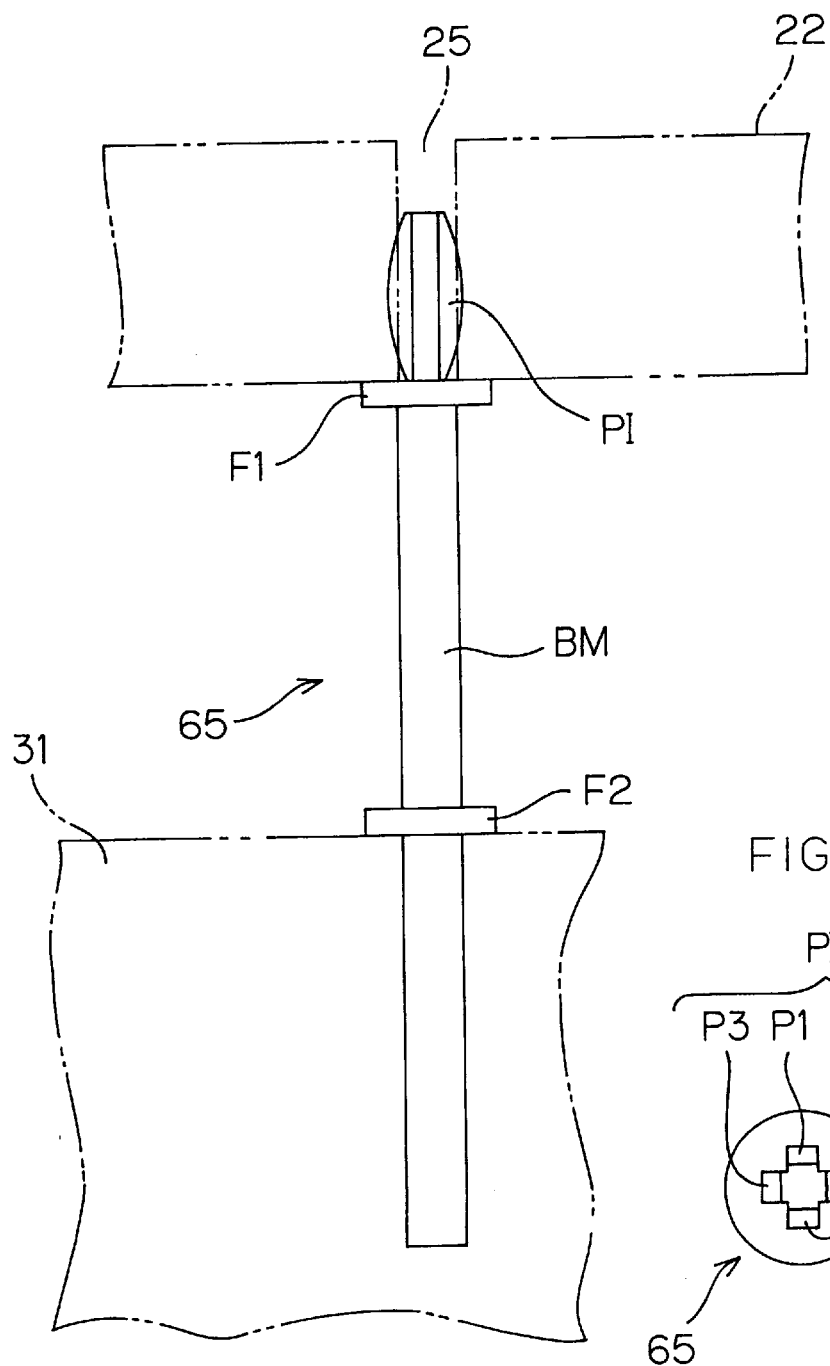

SOCKET AND ADAPTER INTEGRATED CIRCUIT, AND INTEGRATED CIRCUIT ASSEMBLY

BACKGROUND OF THE INVENTION

1. Field of the Invention

The present invention relates to a socket and an adapter for an integrated circuit which permit an integrated circuit such as a CPU package to be mounted on a primary wiring board such as a motherboard, and to an integrated circuit assembly, such as a CPU accelerator, which utilizes the socket and the adapter.

2. Description of Related Art

Motherboards incorporated in personal computers are generally provided with a socket for mounting of a CPU. The socket is adapted to be fitted with a so-called PGA (pin grid array) package containing a chip such as a CPU.

With rapid CPU development, higher performance CPUs have successively be introduced onto the market. Personal computers are upgraded for higher-speed computation by replacing a CPU of old type with a higher-performance CPU of new type. The upgrade is indispensable for using more advanced software without any stress while efficiently utilizing existing hardware resources.

However, the old CPU and the new CPU do not necessarily have the same driving voltage and the same signal pin array, so that the upgrade cannot be achieved as desired only by the replacement of the PGA package.

The upgrade of the CPU is typically achieved by employing an adapter for adaptation of the driving voltage and signals between the socket on the motherboard of the existing personal computer and the new CPU. The most common product for the CPU upgrade on the market is a CPU accelerator which includes an adapter as described above and a CPU of new type in combination.

FIG. 11 is a schematic diagram illustrating the construction of a conventional CPU accelerator. In FIG. 11, the CPU accelerator 100 attached to a socket 121 of a motherboard 120 is viewed along a surface of the motherboard 120. The socket 121 is a so-called "Socket7" which is mounted on the motherboard 120. A PGA package 130 (CPU package) incorporating a CPU is usually attached to the socket 121 as shown in FIG. 13.

Referring to FIG. 11, the CPU accelerator 100 includes a PGA package 101 (CPU package) incorporating a CPU, a PGA socket 102 fitted with the PGA package 101, a first intermediate printed wiring board 103 having the PGA socket 102 mounted thereon, a second intermediate printed wiring board 104 for adaptation of a driving voltage, a signal and the like, and a cooling device 105 provided on the PGA package 102 for cooling the CPU.

The PGA socket 102 receives and holds all of a plurality of pins 106 projecting from a lower surface of the PGA package 101. More specifically, a plurality of pins 107 are implanted in a lower surface of the PGA socket 102, and respectively have pin holders provided at heads thereof for receiving and holding the pins 106 of the PGA package 101. The pins 107 of the PGA socket 102 are all fixed onto the first intermediate printed wiring board 103 by soldering.

The first intermediate printed wiring board 103 is provided with a voltage regulator circuit for transforming a voltage supplied from the motherboard 120, for example, from 3.3V to 2.2V and supplying the voltage to the PGA package 101, a circuit for setting a clock factor for generating a CPU drive clock by multiplying a base clock supplied from the motherboard 120 by an integer, a power supply circuit for supplying power to the cooling fan 105, and the like.

The plurality of pins 107 of the PGA socket 102 include signal pins 107A for transmission of an address signal and a data signal, setting pins 107B for transmission of a clock factor setting signal and the like, and relay pins 107C for supplying a source voltage from the first intermediate printed wiring board 103 to the PGA package 101 and for transmitting a signal which needs to be subjected to a signal adaptation process.

A plurality of pins 111 project from a lower surface of the first intermediate printed wiring board 103 in a parallel relation. Of the plurality of pins 111, pins 111A which are implanted in association with the signal pins 107A are respectively connected to the signal pins 107 via solder portions 112 embedded in through-holes formed in the first intermediate printed wiring board 103 as shown in FIG. 12 on a greater scale. The pins 111 are provided neither in association with the setting pins 107B nor just below the relay pins 107C. The relay pins 107C are each connected to the voltage regulator circuit or the like on the first intermediate printed wiring board 103 or to an interconnection conductor provided on the first intermediate printed wiring board 103. Of the plurality of pins 111, pins 111C associated with the relay pins 107C are implanted in positions not just below the relay pins 107C.

A circuit for supplying a source voltage from the motherboard to the pins 111C and a circuit for converting a pin arrangement are provided on the second intermediate printed wiring board 104. The pins 111A of the first intermediate printed wiring board 103 associated with the signal pins 107A extend through the second intermediate printed wiring board 104 to be held thereby. Further, the second intermediate printed wiring board 104 has pins 113 associated with the pins 111C in a coaxial relation with respect to the relay pins 107C. The pins 113 and the pins 111A are fitted in the socket 121 on the motherboard 120.

With the CPU accelerator 100 being mounted on the motherboard 120 as shown in FIG. 11, a lower surface of the second intermediate printed wiring board 104 abuts against an upper surface of the socket 121, whereby the pins 113, 111A are prevented from being inserted slantwise into the socket 121.

In the conventional CPU accelerator 100 described above, however, the two intermediate printed wiring boards, i.e., the first and second intermediate printed wiring boards 103 and 104, are vertically stacked, so that a great number of components are incorporated therein. This increases component costs and production costs with an increased number of assembly steps.

With the two printed wiring boards vertically stacked, the CPU accelerator 100 inevitably has a greater height. Particularly, where the CPU accelerator 100 is to be accommodated in a smaller-size housing, the CPU accelerator will suffer from limitations of space, thereby spatially interfering with other components or interior wall surfaces of the housing.

SUMMARY OF THE INVENTION

It is an object of the present invention to provide a socket for an integrated circuit which allows for reduction in the number of components in an integrated circuit adapter and an integrated circuit assembly.

It is another object of the present invention to provide an adapter for an integrated circuit which has a reduced number of components.

It is further another object of the present invention to provide an integrated circuit assembly which has a reduced number of components.

The socket for an integrated circuit in accordance with the present invention is used for attaching the integrated circuit to a socket mounted on a primary wiring board with an intermediate wiring board interposed therebetween, and comprises: a housing to be directly fitted with the integrated circuit; a long insertion pin which is to be inserted through the intermediate wiring board and to be fitted in the socket of the primary wiring board; a short insertion pin which is to be inserted through the intermediate wiring board but not to reach the socket of the primary wiring board; and a surface-mount pin which is to be connected to a surface of the intermediate wiring board opposed to the housing; the long insertion pin, the short insertion pin and the surface-mount pin being implanted in the housing.

The primary wiring board may be, for example, a motherboard mounted in a personal computer. The integrated circuit may be, for example, a CPU package incorporating a CPU. Further, the intermediate wiring board may be provided with a source voltage transforming circuit for transforming a source voltage supplied from the primary wiring board and supplying the transformed voltage to the integrated circuit, a setting circuit for applying a predetermined signal such as a setting signal to the integrated circuit, a signal converting circuit for converting a signal to be transmitted between the primary wiring board and the integrated circuit, and the like.

The pins implanted in the housing preferably each have a terminal connector to be connected to a terminal of the integrated circuit.

The integrated circuit socket of the present invention includes three types of pins, i.e., the long insertion pin which is to be inserted through the intermediate wiring board to reach the socket of the primary wiring board, the short insertion pin which is to be inserted through the intermediate wiring board but not to reach the socket of the primary wiring board, and the surface-mount pin which is to be attached onto the surface of the intermediate wiring board. With this arrangement, the long insertion pin serves to directly transmit a signal and the like (signal and operating source voltage) between the integrated circuit and the primary wiring board, and the short insertion pin solely serves to transmit a signal between the intermediate wiring board and the integrated circuit. The surface-mount pin serves to transmit a signal which requires conversion for adaptation thereof between the integrated circuit and the primary wiring board.

Thus, functions required for mounting the integrated circuit such as the CPU package on the primary wiring board such as the motherboard can be fulfilled by the provision of the single intermediate wiring board. This results in reduction in the number of components in an integrated circuit assembly such as a CPU accelerator, thereby reducing the costs and the number of assembly steps.

In addition, the height of the integrated circuit assembly can be reduced, unlike the prior art which requires two intermediate printed boards provided in a stacked relation.

In accordance with an embodiment of the invention, the long insertion pin includes a branch pin which is to be electrically connected to a circuit provided on the intermediate wiring board.

With this arrangement, the signal and the like transmitted between the primary wiring board and the integrated circuit can be taken into the circuit provided on the intermediate wiring board, so that the circuit on the intermediate wiring board can perform a process by utilizing the signal taken therein.

The long insertion pin may include a through-pin which is to be electrically isolated from a circuit provided on the intermediate wiring board.

With this arrangement, the use of the through-pin prevents the signal and the like transmitted between the integrated circuit and the primary wiring board from being needlessly inputted into the circuit provided on the intermediate wiring board.

The short insertion pin preferably includes a pin which is to be electrically connected to a circuit provided the intermediate wiring board and electrically isolated from the primary wiring board.

Thus, a setting signal and the like generated on the intermediate wiring board independently of the primary wiring board can be inputted to the integrated circuit.

Preferably, the surface-mount pin includes a pin which is to be electrically connected to a circuit provided on the intermediate wiring board.

With this arrangement, connection between the integrated circuit and the circuit provided on the intermediate wiring board can be achieved by the surface-mount pin.

The surface-mount pin preferably includes a terminal connector to be connected to a terminal (e.g., a terminal pin) of the integrated circuit, and a board contact portion to be connected to the intermediate wiring board in a position offset from the terminal of the integrated circuit. With this arrangement, a relay pin for connection between the intermediate wiring board and the socket of the primary wiring board can be provided on the intermediate wiring board in alignment with the terminal of the integrated circuit.

Further, the long insertion pin preferably has an over-insertion preventing mechanism for restricting an insertion depth thereof with respect to the socket mounted on the primary wiring board.

With this arrangement, the integrated circuit socket (and an integrated circuit adapter and an integrated circuit assembly utilizing the socket) can be attached to the socket of the primary wiring board in a proper attitude by the function of the over-insertion preventing mechanism of the long insertion pin.

Particularly, where the socket has a plurality of long insertion pins, at least some of the long insertion pins (necessarily not all the long insertion pins) disposed in a properly distributed manner may each be provided with the over-insertion preventing mechanism. This permits the plurality of pins of the integrated circuit socket to be fitted in the socket of the primary wiring board in a proper attitude for prevention of slant insertion thereof.

The over-insertion preventing mechanism may be a step portion defined between a thin pin portion of the long insertion pin provided adjacent a distal end thereof and a thick pin portion of the long insertion pin provided closer to a proximal end thereof than the thin pin portion (on the side of the housing of the socket). In this case, the thin pin portion is brought into contact with a contact of the socket of the primary wiring board, while the step portion abuts against a surface of the socket to restrict insertion of the thick pin portion into the socket.

The adapter for an integrated circuit in accordance with the present invention is used for attaching the integrated circuit to a socket mounted on a primary wiring board, and comprises an intermediate wiring board which is to be interposed between the integrated circuit to be attached and the socket mounted on the primary wiring board, and the aforesaid integrated circuit socket.

With this arrangement, a signal converting process and the like required for connection between the integrated circuit and the primary wiring board can be achieved by the provision of the single intermediate wiring board. Therefore, the number of components can be reduced thereby to reduce the costs and the number of assembly steps. Further, the height of an integrated circuit assembly can be reduced as required.

The long insertion pin is preferably fixed to the intermediate wiring board by soldering or the like. This improves the mechanical strength of the integrated circuit adapter.

The intermediate wiring board preferably has a relay pin which is provided on a surface thereof to be opposed to the socket of the primary wiring board in association with the surface-mount pin, and is to be fitted in the socket of the primary wiring board.

With this arrangement, the relay pin serves for connection between a circuit provided on the intermediate wiring board and the socket of the primary wiring board and for physical support of a major portion of the intermediate wiring board.

Further, the relay pin preferably includes a pin which is connected to a circuit provided on the intermediate wiring board.

With this arrangement, the circuit provided on the intermediate wiring board can be connected to the primary wiring board via the relay pin. Where the relay pin and the surface-mount pin are connected to input and output ports of a signal converting circuit or a source voltage transforming circuit provided on the intermediate wiring board, for example, conversion of a signal and the like between the primary wiring board and the integrated circuit is permitted.

The relay pin preferably has an over-insertion preventing mechanism for restricting an insertion depth thereof with respect to the socket mounted on the primary wiring board.

The over-insertion preventing mechanism may be a flange provided adjacent a distal end of the relay pin on the side of the socket on the primary wiring board. In this case, a portion of the relay pin between the flange and the distal end thereof on the side of the socket is brought into contact with a contact of the socket, while the flange abuts against the surface of the socket for restriction of the insertion depth of the relay pin.

The over-insertion preventing mechanism may be a step portion defined between a thin pin portion of the relay pin provided adjacent the distal end thereof and a thick pin portion of the relay pin provided closer to a proximal end thereof than the thin pin portion (on the side of the intermediate wiring board). In this case, the thin pin portion is brought into contact with the contact of the socket on the primary wiring board, while the step portion abuts against the surface of the socket to prevent the thick pin portion from being inserted into the socket.

The integrated circuit assembly according to the present invention, which is attached to a socket mounted on a primary wiring board for use, comprises an integrated circuit, and the aforesaid integrated circuit adapter which is attached to the integrated circuit.

With this arrangement, adaptation of a signal and the like between the integrated circuit and the primary wiring board can be achieved with the use of the single intermediate wiring board, so that the number of components in the integrated circuit assembly can be reduced. This reduces the costs and the number of assembly steps. In addition, the height of the integrated circuit assembly can be reduced as required.

The integrated circuit may be a CPU package incorporating a CPU, and the integrated circuit assembly may be a CPU accelerator.

With this arrangement, a CPU accelerator can be provided which features a reduced number of components, lower costs and a reduced number of assembly steps.

Preferably, the long insertion pin includes a signal pin for transmitting a signal on an "as is" basis between the integrated circuit and the primary wiring board, and the short insertion pin includes a setting pin for applying a setting signal to the integrated circuit from the intermediate wiring board. Further, the surface-mount pin preferably includes a pin which is to be connected to the primary wiring board via a conversion circuit provided on the intermediate wiring board.

This arrangement allows for the signal transmission between the integrated circuit and the primary wiring board, the application of the setting signal to the integrated circuit independent of the primary wiring board, and the transmission of a signal and the like (signal and source voltage) between the integrated circuit and the conversion circuit on the intermediate wiring board.

The foregoing and other objects, features and effects of the present invention will become more apparent from the following description of the preferred embodiments with reference to the attached drawings.

BRIEF DESCRIPTION OF THE DRAWINGS

FIGS. 7A and 7B are diagrams illustrating the construction of a relay pin;

DESCRIPTION OF THE PREFERRED EMBODIMENTS

Figure 1:
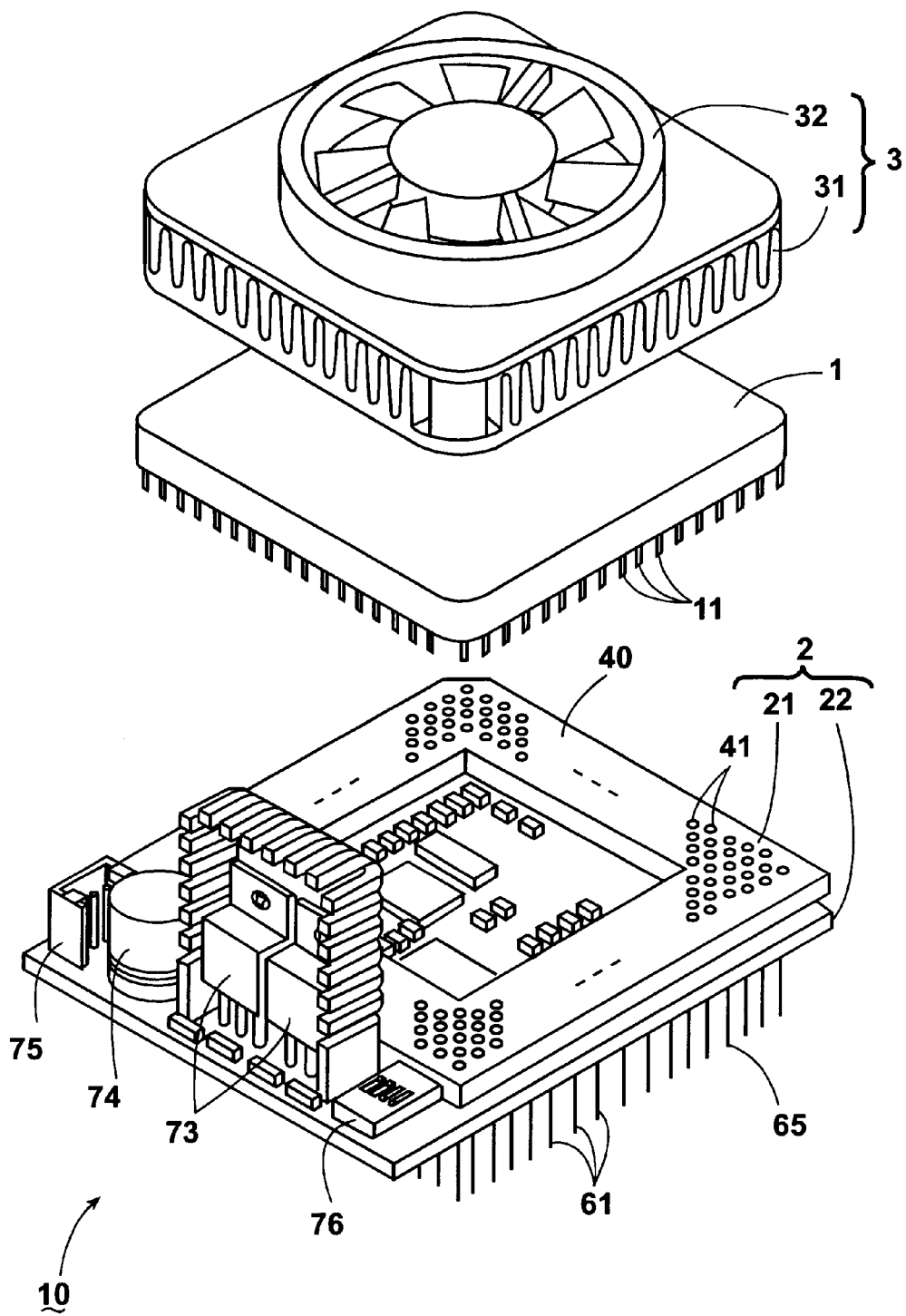
FIG. 1 is a perspective view of a CPU accelerator according to one embodiment of the present invention.
Figure 2:
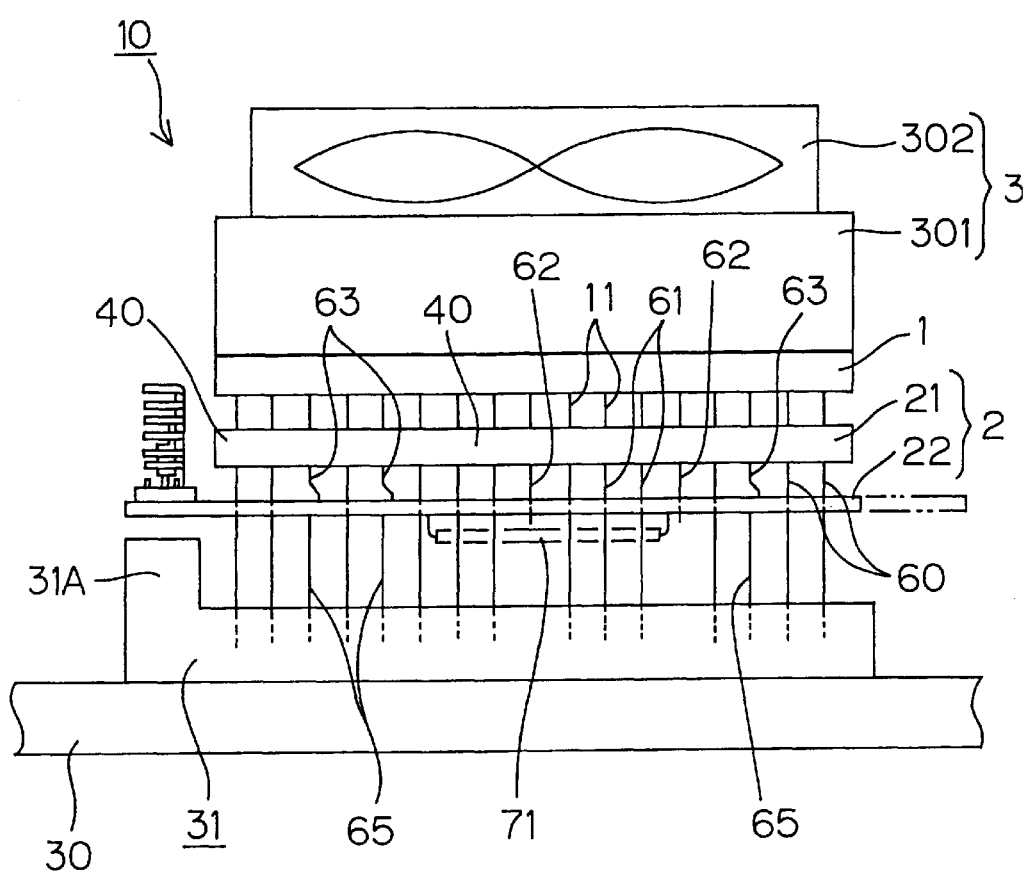
FIG. 2 is a schematic side view of the CPU accelerator.

FIG. 1 is a perspective view of a CPU accelerator 10 (integrated circuit assembly) according to one embodiment of the present invention, and FIG. 2 is a schematic side view illustrating the CPU accelerator 10, which is attached to a motherboard socket 31 (e.g., a so-called "Socket7") mounted on a motherboard 30 (primary wiring board) of a personal computer, as seen along a surface of the motherboard 30.

The CPU accelerator 10 has a PGA package 1 (CPU package) incorporating a CPU, an adapter 2 (integrated circuit adapter) for attaching the PGA package 1 to the motherboard connector 31, and a cooling device 3 provided on an upper surface of the PGA package 1 for cooling the PGA package 1. The cooling device 3 has a heat sink 301 provided in intimate contact with the upper surface of the PGA package 1, and a cooling fan 302 provided on the top of the heat sink for assisting heat dissipation from the heat sink 301.

The adapter 2 has a PGA socket 21 (integrated circuit socket) to be fitted with the PGA package 1, and a printed wiring board 22 (intermediate wiring board) fitted with the PGA socket 21. The PGA socket 21 has a synthetic resin housing 40 having a rectangular frame shape as viewed in plan, and a plurality of pins 60 projecting from a lower surface of the housing 40. A plurality of pins (terminals) are implanted in a lower surface of the PGA package 1 as projecting therefrom. The PGA socket 21 is formed with a plurality of holes 41 which are arranged in alignment with the respective pins 11 of a pin array of the PGA package 1 to receive the respective pins 11, as shown in FIG. 3 which is a plan view of the CPU accelerator with the PGA package 1 and the cooling device 3 removed therefrom.

The plurality of pins 60 of the PGA socket 21 are respectively implanted in the plurality of holes 41 as projecting downward. As shown in FIG. 2, the plurality of pins 60 include long insertion pins 61 extending through the printed wiring board 22 to reach the motherboard socket 31, short insertion pins 62 extending through the printed wiring board 22 not to reach the motherboard 31, and surface-mount pins 63 which do not extend through the printed wiring board 22 but surface-mounted on interconnection conductors provided on a surface of the printed wiring board. Most of the pins 60 are the long insertion pins 61.

A gate array 71 for signal conversion (signal converting circuit: one of conversion circuits) is provided on a lower surface of the printed wiring board 22 to be opposed to the motherboard socket 31, and the PGA socket 21 is mounted on the upper surface of the printed wiring board 22 on the opposite side. In the lower surface of the printed wiring board 22, relay pins 65 are implanted in association with the surface-mount pins 63 in a coaxial relation with respect to the corresponding pins 11 of the PGA package 1.

Figure 3:
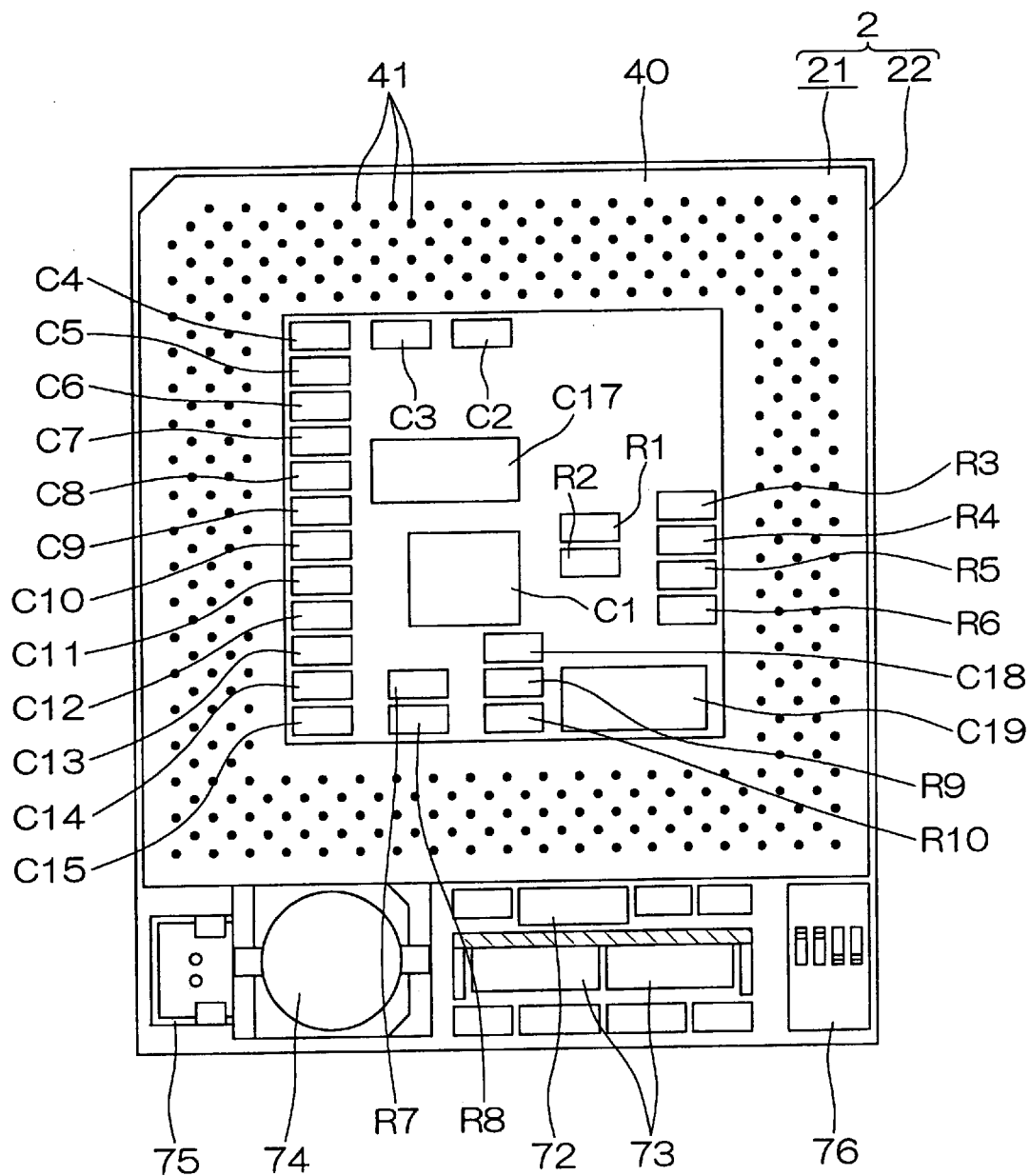
FIG. 3 is a plan view of the CPU accelerator with a PGA package and a cooling device removed therefrom.

As best shown in FIG. 3, a regulator IC 72, a power transistor 73, an electrolytic capacitor 74, a power supply connector for the cooling fan, dip switches 76 for setting a clock factor (setting circuit), and the like are mounted in a region of the upper surface of the printed wiring board 22 aside from the PGA socket 21. Capacitors C1 to C19 such as an aluminum electrolytic capacitors and ceramic capacitors and resistors R1 to R10 are mounted in a region of the printed wiring board facing a rectangular center opening of the rectangular frame-shaped housing 40 of the PGA socket 21.

Figure 4:
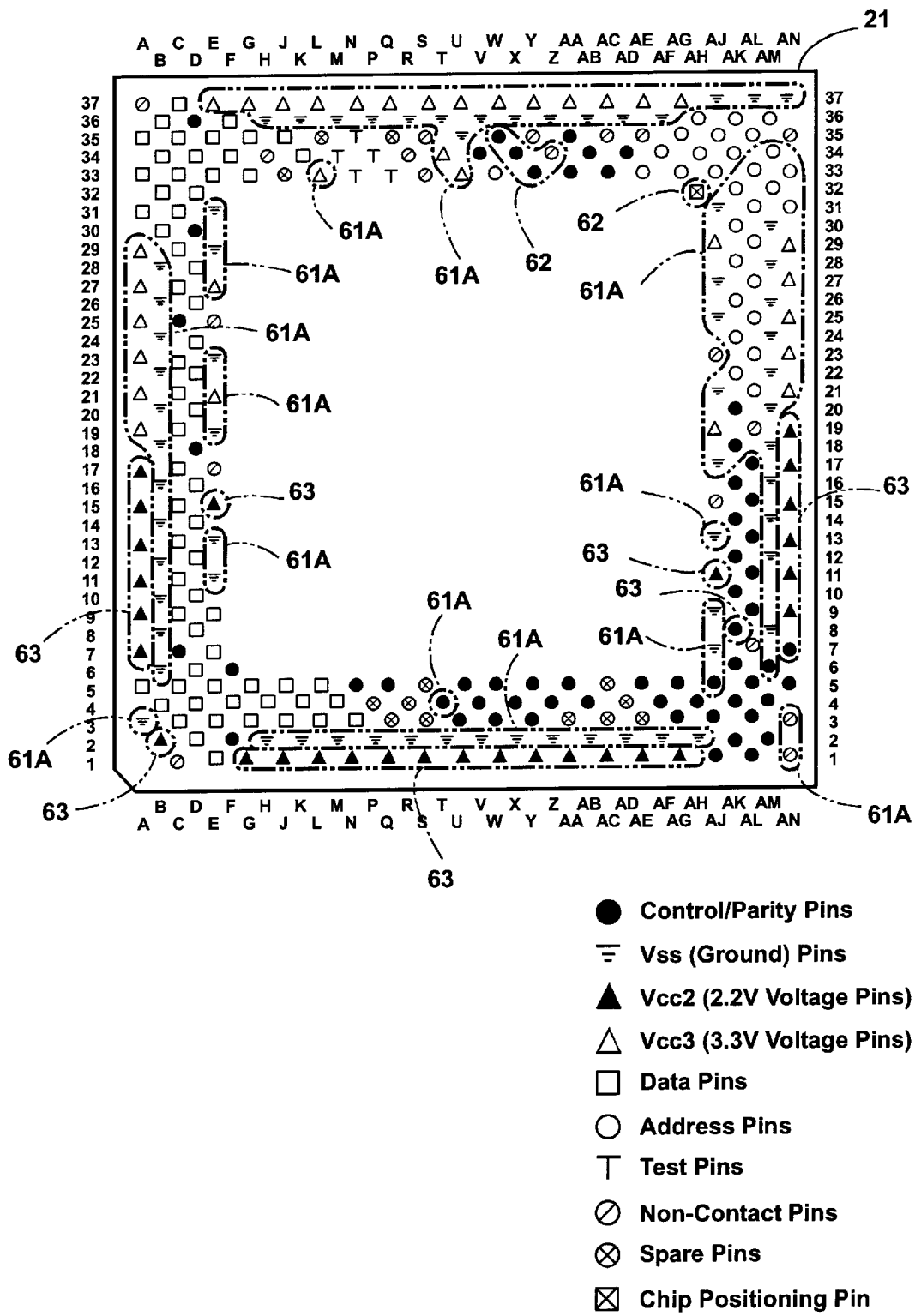
FIG. 4 is a plan view illustrating a pin arrangement. with notation of signals to be transmitted through pins; located in different positions of a PGA socket.

FIG. 4 is a plan view illustrating a pin arrangement with notation of signals to be transmitted through the pins 60 located in different positions of the PGA socket 21. The types of signals transmitted through the respective pins 60 are represented by symbols in FIG. 4. The positions of the long insertion pins 61, the short insertion pins 62, the surface-mount pins 63 are also shown in FIG. 4. As shown in FIG. 4, the long insertion pins 61 are classified into two types, i.e., branch pins 61A which are connected to circuits provided on the printed wiring board 22 and are to be fitted in the motherboard socket 31, and through-pins 61B which extend through the printed wiring board 22 but are not connected to the circuits on the printed wiring board 22 (pins which are not specifically denoted in FIG. 4 are the through-pins 61B).

As can be understood from FIG. 4, signal pins which should serve for transmission of data, addresses and the like between the motherboard 30 and the PGA package 1 are constructed as the long insertion pins 61. The clock factor, for example, is set by the clock factor setting dip switches 76 mounted on the printed wiring board 22 and, therefore, setting pins which serve for transmission of signals generated by circuits on the printed wiring board 22 independently of the motherboard 30 are constructed as the short insertion pins 62. Further, pins which serve to output from the printed wiring board 22 a voltage for the PGA package 1 which is different from a voltage supplied from the motherboard 30 and to transmit a timing signal which should be subjected to a signal adaptation process are constructed as the surface-mount pins 63.

Figure 5:
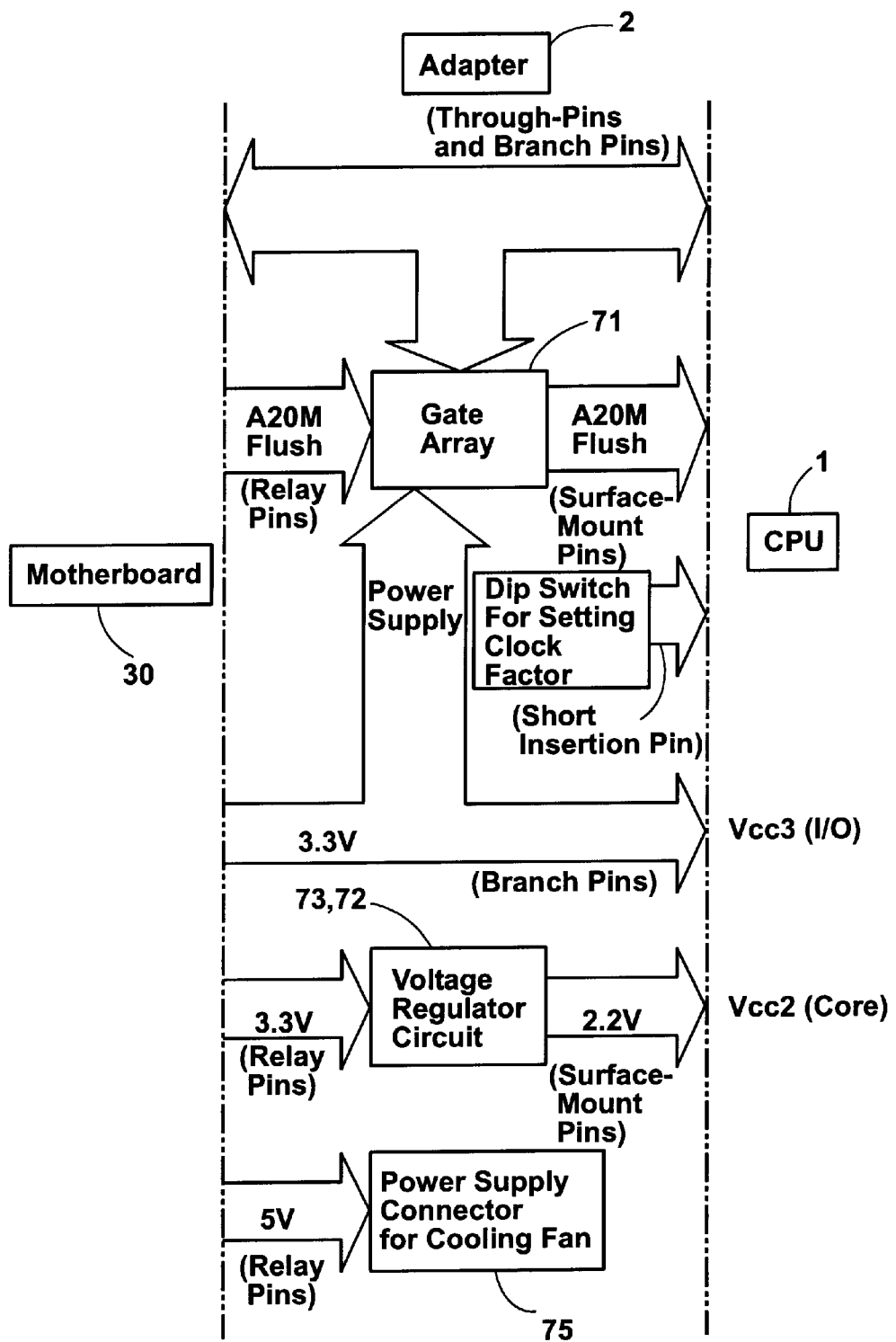
FIG. 5 is a block diagram illustrating the electrical. construction of an adapter constituted by the PGA socket and a printed wiring board.

FIG. 5 is a block diagram illustrating the electrical construction of the adapter 2 constituted by the PGA socket 21 and the printed wiring board 22. The motherboard 30 generates source voltages of 3.3 V and 5 V, which are supplied to the adapter 2 via the motherboard socket 31. The 3.3 V source voltage is supplied via branch pins 61A to the PGA package 1 and to the gate array 71 provided on the lower surface of the printed wiring board 22. In the PGA package 1, the 3.3 V source voltage is used in circuit portions associated with I/O of the CPU. Further, the gate array 71 is operative at the 3.3 V source voltage.

A core portion of the CPU is operative, for example, at an operating voltage of 2.2 V. In this respect, the voltage is transformed from 3.3 V to 2.2 V by a voltage regulator circuit (source voltage transforming circuit: one of the conversion circuits) comprised of the regulator IC 72 and the power transistor 73 mounted on the printed wiring board 22, and supplied to the PGA package 1. To fulfill such functions, a relay pin 65 is used for the supply of the 3.3 V voltage to the printed wiring board 22 from the motherboard socket 31, and a surface-mount pin 63 is used for the supply of the 2.2 V voltage to the PGA package 1 from the regulator circuit on the printed wiring board 22. If a short insertion pin 62 was used, a short-circuit to the relay pin 65 would occur. Therefore, the surface-mount pin 63 should be used which is connectable to the printed wiring board 22 in a position separate from the relay pin 65.

The 5 V voltage generated by the motherboard 30 is supplied to the cooling fan power supply connector 75 via a relay pin 65. The 5 V voltage is not necessary for the PGA package 1.

The gate array 71 is a signal converting circuit for adaptation to a motherboard of a personal computer of "PC-98 series" (registered trademark of NEC Corporation) mainly available from NEC Corporation. Some of address signals and a reset signal are inputted to the gate array 71 via branch pins 61A. A signal A20M for emulation of the operation of the 8086 microprocessor in a real mode and a signal FLUSH for writing cached data back into a main memory and clearing the data in a cache are inputted to the gate array 71 via relay pins 65. Further, the 3.3 V voltage is supplied to the gate array 71 via another branch pin 61A. Signals converted by the gate array 71 are outputted to the PGA package 1 via surface-mount pins 63.

Figure 6A:
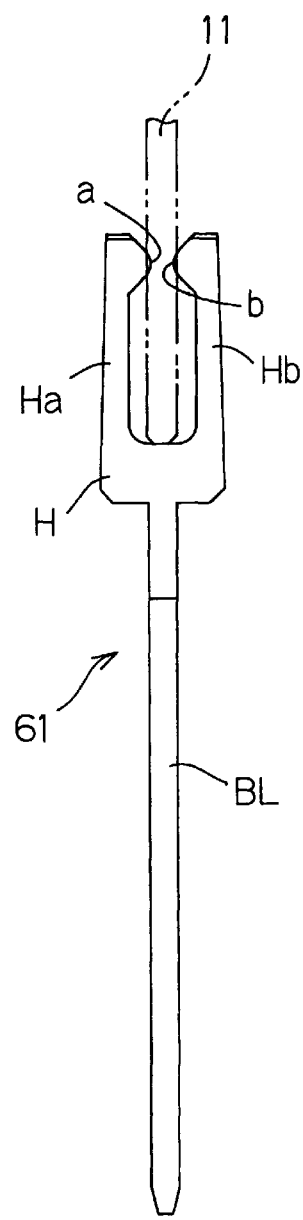
FIGS. 6A, 6B and 6C are front views for explaining the constructions of pins of the PGA socket.
Figure 6B:
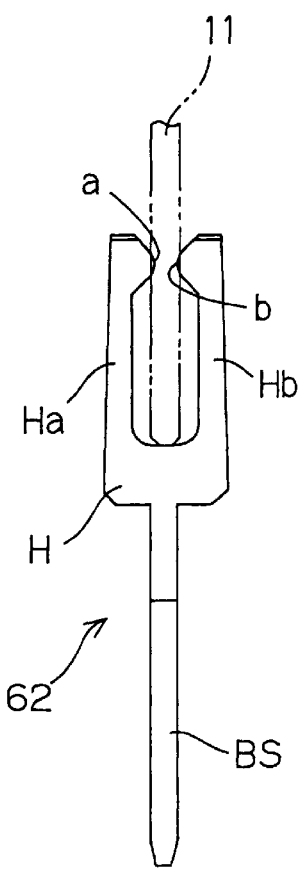
Figure 6C:
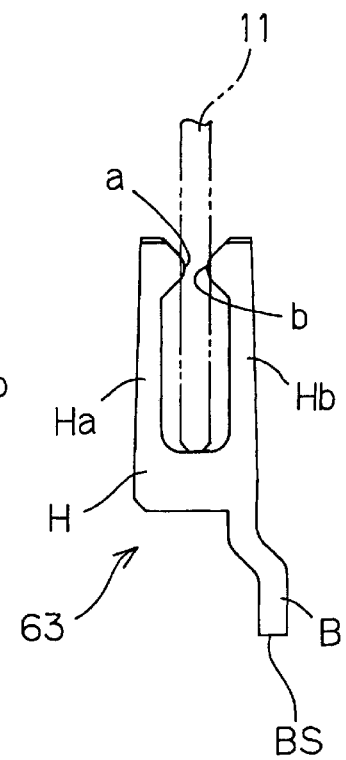

FIGS. 6A, 6B and 6C are front views for explaining the constructions of the pins 60 of the PGA socket 21. Particularly, FIGS. 6A, 6B, 6C illustrate the long insertion pin 61, the short insertion pin 62 and the surface-mount pin 63, respectively.

The long insertion pins 61 each have a pin holder H (terminal connector) for receiving and holding a distal end of a pin 11 of the PGA package 11, and a pin body BL which extends straight from a lower end of the pin holder H and is long enough to extend through the printed wiring board 21 to reach the motherboard socket 31. The pin body BL has a generally constant thickness between its proximal end (connected to the pin holder H) and its distal end portion which is tapered for easy insertion thereof into the motherboard socket 31. The distal end portion of the body BL is brought into contact with a contact of the motherboard socket 31.

The pin holder H has a pair of holder arms Ha, Hb, and is of a generally U-shape with an open top (opening toward the PGA package 1). A distance between the arms Ha and Hb decreases toward the open top. The arms Ha and Hb respectively have holder projections a and b for holding the pin 11. With this arrangement, when the pin 11 of the PGA package 1 is inserted between the arms Ha and Hb, the arms Ha, Hb are resiliently deformed apart from each other to receive the pin 11, and hold the pin 11 by their restoring forces for prevention of withdrawal of the pin. With the pin 11 being held between the arms Ha and Hb, the pin 11 is kept in a coaxial relation with respect to the pin body BL.

The short insertion pins 62 each have substantially the same construction as the long insertion pins 61, except that a pin body BS thereof has a length that permits the pin 62 to extend through the printed wiring board 22 but not to reach the motherboard socket 3l. In FIG. 6B, portions of the pin corresponding to those illustrated in FIG. 6A are denoted by the same reference characters as in FIG. 6A. With a pin 11 of the PGA package 1 being held by the pin holder H, the pin 11 is kept in a coaxial relation with respect to the short insertion pin 62. The pin body BS has a generally constant thickness between its proximal end and its distal end portion ,which is tapered. The distal end portion of the body BS is brought into contact with a contact of the motherboard socket 31.

The surface-mount pins 63 each have substantially the same construction as the long insertion pins 61 and the short insertion pins 62 except the structure of a pin body B thereof. In FIG. 6C, portions of the pin corresponding to those illustrated in FIG. 6A are denoted by the same reference characters as in FIG. 6A. The pin body B projects from a portion of a pin holder H adjacent to one arm Hb as extending apart from the arm Hb parallel to an insertion direction of a pin 11, and is bent at an angle. The pin body B is further bent to extend parallel to the insertion direction of the pin 11. Thus, the pin body B is disposed in an offset relation with respect to an axis of the pin 11 held by the pin holder H, so that a distal end Bs (board contact portion) thereof which serves as a mounting contact is offset from the axis of the pin 11. The distal end Bs has a large rectangular contact area for easy mounting of the surface-mount pin on the surface of the printed wiring board 22.

FIG. 7A is a front view illustrating the construction of the relay pin 65. The relay pins 65 each have a straight pin body BM, an press-in portion P1 provided at one end of the pin body BM and adapted to be press-fitted in a hole 25 of the printed wiring board 22, a first flange F1 provided below the press-in portion P1 and adapted to abut against the lower surface of the printed wiring board 22 (which is to be opposed to the motherboard socket 31), and a second flange F2 provided at an intermediate portion of the pin body BM and adapted to abut against an upper surface of the motherboard socket 31. A portion of the pin body BM below the second flange F2 is brought into contact with a contact of the motherboard socket 31.

As shown in a plan view of FIG. 7B, the press-in portion P1 has a generally cross shape in plan with four retainers P1 to P4 projecting radially and equidistantly. The retainers P1 to P4 each have an outwardly bulged exterior for easy insertion of the relay pin into the hole of the printed wiring board 22.

Figure 8:
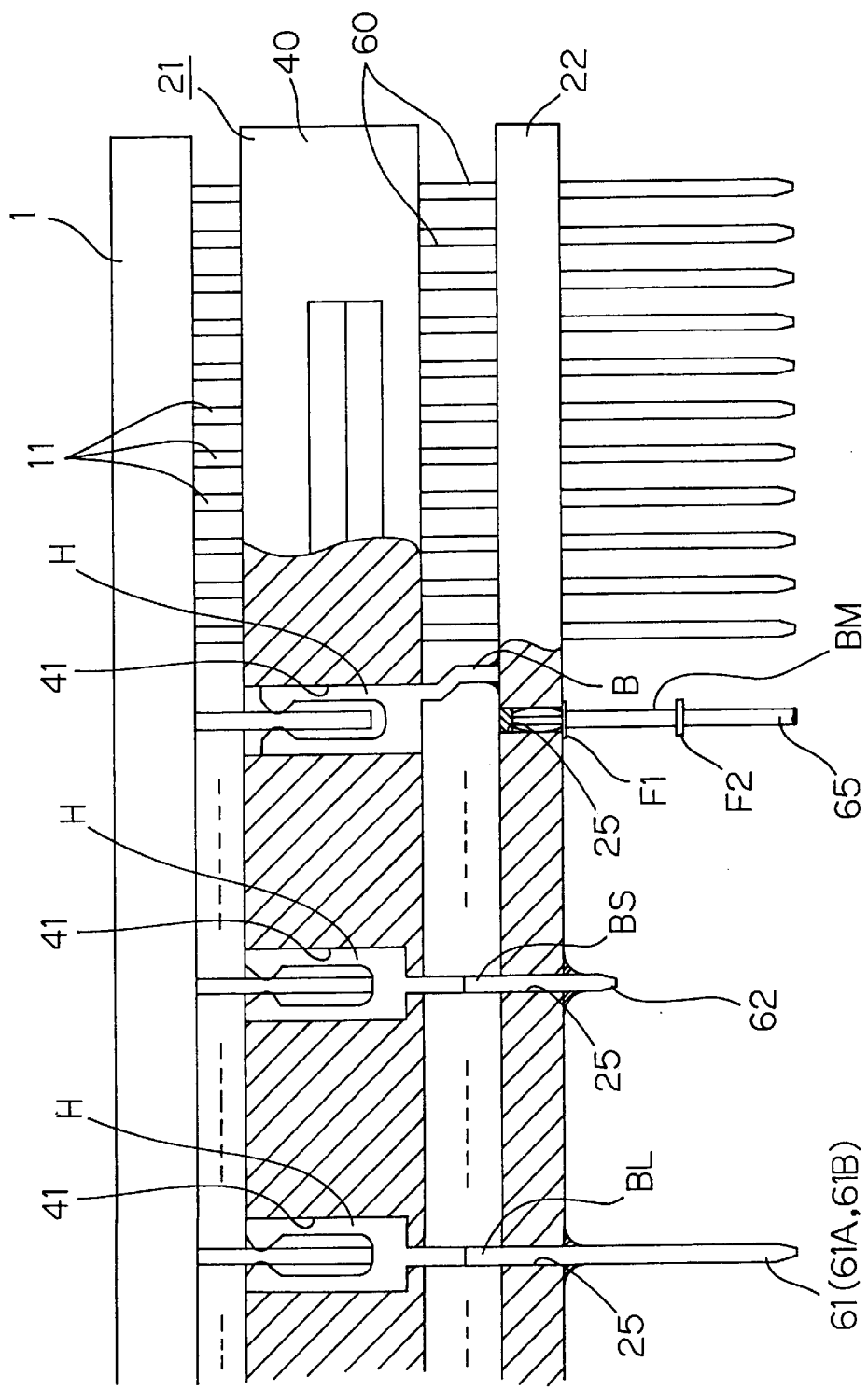
FIG. 8 is a sectional view for explaining the fitting of a long insertion pin, a short insertion pin, a surface-mount pin and a relay pin.

Referring now to FIG. 8, an explanation will be given to the fitting of the long insertion pins 61, the short insertion pins 62, the surface-mount pins 63 and the relay pins 65. The long insertion pins 61, the short insertion pins 62 and the surface-mount pins 63 are press-inserted in the corresponding holes formed in the housing 40 of the PGA socket 21 from the upper side thereof. The holes 41 for the long insertion pins 61 and the short insertion pins 62 each have a pair of shoulders provided at lower portions thereof and abutting against opposite portions of the lower end of the pin holder H, and the pair of shoulders define a small through-hole therebetween, in which the pin body BL, BS is inserted. On the other hand, the holes 41 for the surface-mount pins 63 each have a configuration that permits the pin holder H of the surface-mount pin 63 to be inserted therethrough. The long insertion pins 61, the short insertion pins 62 and the surface-mount pins 63 are implanted in the housing 40 of the PGA socket 21 with the pin bodies BL, BS, B thereof projecting from the lower surface of the printed wiring board 22.

The pinholders H of the pins 61, 62, 63 are reinforced by the insertion thereof in the corresponding holes 41 to assuredly provide a desired resilient retainability.

Metal patterns having an excellent solder wettability are provided around peripheral edges of the holes 25 for the long insertion pins 61 and the short insertion pins 62 on the lower surface of the printed wiring board. The long insertion pins 61 and the short insertion pins 62 are respectively soldered to the metal patterns thereby to be fixed to the printed wiring board 22.

The metal patterns to which the branch pins 61A of the long insertion pins 61 are soldered are connected to interconnection conductors provided on the lower surface of the printed wiring board 22. Where the branch pins 61A are required to be electrically connected to interconnection conductors or circuits on the printed wiring board 22, through-holes are formed in the printed wiring board 22 and interior surfaces of the through-holes are plated with a conductive material for connection between the interconnection conductors provided on the upper and lower surfaces of the printed wiring board 22. In this case, the holes 25 through which the branch pins 61A are inserted may be utilized as the through-holes.

Connection between the short insertion pins 62 and interconnection conductors on the upper and/or lower surfaces of the printed wiring board 22 may be achieved in the same manner as described above.

The through-pins 61B of the long insertion pins 61 need not be electrically connected to the interconnection conductors on the upper or lower surface of the printed wiring board 22, so that the soldering of the through-pins 61B to the printed wiring board 22 solely aims at enhancement of the mechanical strength. Therefore, the through-pins 61B may be fixed to the printed wiring board 22 in any other ways (e.g., by press-fitting thereof into the holes 25 or with the use of an adhesive). It is not necessarily required to bond the through-pins 61B to the printed wiring board 22, if a sufficient mechanical strength can be provided simply by bonding the branch pins 61A and the short insertion pins 62 to the printed wiring board 22 by soldering.

The soldering of the long insertion pins 61 and the short insertion pins 62 to the lower surface of the printed wiring board 22 may be achieved by a manual operation or, alternatively, by a dip method in which the printed wiring board 22 preliminarily fitted with these pins 61, 62 (e.g., by press-fitting the pins into the holes 25) is dipped in a molten solder vessel.

The long insertion pins 61 and the short insertion pins 62 may be soldered to the upper surface of the printed wiring board 22 (opposite from the motherboard socket 31). In this case, metal patterns are provided around peripheral edges of the holes 25 for the long insertion pins 61 and the short insertion pins 62 on the upper surface of the printed wiring board 22. The long insertion pins 61 and the short insertion pins 62 are respectively soldered to the metal patterns. The long insertion pins 61 and the short insertion pins 62 can electrically be connected to the interconnection conductors on the upper and/or lower surfaces of the printed wiring board 22 in the same manner as described above.

The soldering of the long insertion pins 61 and the short insertion pins 62 to the upper surface of the printed wiring board 22 may be achieved by a manual operation or by a reflow process. In the reflow process, a solder paste is applied to bonding portions on the printed wiring board 22, and then the long insertion pins 61 and the short insertion pins 62 are attached to the printed wiring board 22. The resulting printed wiring board 22 is placed in a hot air flow of a high temperature within a reflow chamber for melting the solder paste. Then, the printed wiring board 22 is taken out of the reflow chamber and cooled. Thus, the molten solder is solidified, whereby the long insertion pins 61 and the short insertion pins 62 are fixed to the printed wiring board 22.

Either one type of pins, i.e., the long insertion pins 61 or the short insertion pins 62, may be soldered on the upper surface of the printed wiring board 22, and the other type of pins may be soldered on the lower surface of the printed wiring board 22. Alternatively, some of the long insertion pins 61 and the short insertion pins 62 may be soldered on the upper surface of the printed wiring board 22, and the other pins may be soldered on the lower surface of the printed wiring board 22.

The surface-mount pins 63 are attached onto the upper surface of the printed wiring board 22 by a so-called surface-mounting method. More specifically, metal patterns connected to interconnection conductors are provided on the upper surface of the printed wiring board 22 in positions opposed to the distal ends Bs of the pin bodies B of the surface-mount pins 63. When the surface-mount pins 63 are bonded to the printed wiring board 22, the long insertion pins and the short insertion pins 62 of the PGA socket 21 are inserted through the printed wiring board 22.

With the printed wiring board 22 and the PGA socket 21 being fixed to each other, the distal ends Bs of the pin bodies B are fixed to the metal patterns on the upper surface of the printed wiring board 22 by soldering. The soldering may be achieved by a manual operation or by a reflow process. In the reflow process, a solder paste is applied to bonding portions of the distal ends Bs of the pin bodies B and the metal patterns, and the resulting printed wiring board is exposed to a hot air flow of a high temperature in a reflow chamber, whereby the solder paste is melted. Then, the printed wiring board 22 is taken out of the reflow chamber and cooled. Thus, the solder is solidified, so that the bonding between the surface-mount pins 63 and the metal patterns is achieved.

The relay pins 65 are fixed to the printed wiring board 22 by press-inserting the press-in portions P1 (see FIG. 7) into the corresponding holes 25 of the printed wiring board 22 from the lower side thereof and then soldering the press-in portions P1 to metal patterns provided around peripheral edges of the holes 25 on the upper surface of the printed wiring board 22. The soldering may be achieved by a manual operation or by a reflow process. In the reflow process, a solder paste is applied to the inside of the holes 25 and the peripheral portions thereof and then the resulting printed wiring board 22 is placed in a reflow chamber. Then, the printed wiring board 22 is taken out of the reflow chamber and cooled. Thus, the solder is solidified, whereby the bonding between the printed wiring board 22 and the relay pins 65 is achieved.

The soldering order of the long insertion pins 61, the short insertion pins 62, the surface-mount pins 63 and the relay pins 65 may properly be determined depending upon a process to be employed. Where the reflow process is employed for the bonding of any pins, however, the soldering by the reflow process is first carried out, and then the other pins are soldered by the manual operation or by the dip method. If these soldering operations are performed in the reverse order, the solder applied by the manual operation or by the dip method will be re-melted in the reflow chamber, making it difficult to provide a desired solder-bonded state.

As clearly indicated in FIG. 7A, the second flanges F2 of the relay pins 65 abut against the surface of the motherboard socket 31. This prevents slant insertion of the pins 60 and 65 into the motherboard 31, and permits the wiring board 22 to be located at a level that prevents positional interference with a projection 31A provided along one edge of the motherboard socket 31.

As can be understood from the pin arrangement shown in FIG. 4, the surface-mount pins 63 under which the relay pins 65 are provided are located in a properly distributed manner, so that the adapter 2 can stably be held in a proper attitude. As required, additional relay pins 65 may be implanted in the printed wiring board 22 in association with non-connection pins and spare pins located at proper positions. This further stabilizes the attitude of the adapter 2 and assuredly prevents the slant insertion of the pins 60 and 65.

In accordance with this embodiment, the PGA socket 21 has three types of pins, i.e., the long insertion pins 61, the short insertion pins 62 and the surface-mount pins 63, which are used depending on the signals to be transmitted therethrough. Therefore, the CPU accelerator 10 can be constructed with the single printed wiring board 22. As a result, the number of the components can be reduced as compared with the prior art and, accordingly, the costs and the number of steps in the production process can be reduced. Thus, the CPU accelerator can be provided at a lower price.

Figure 9:
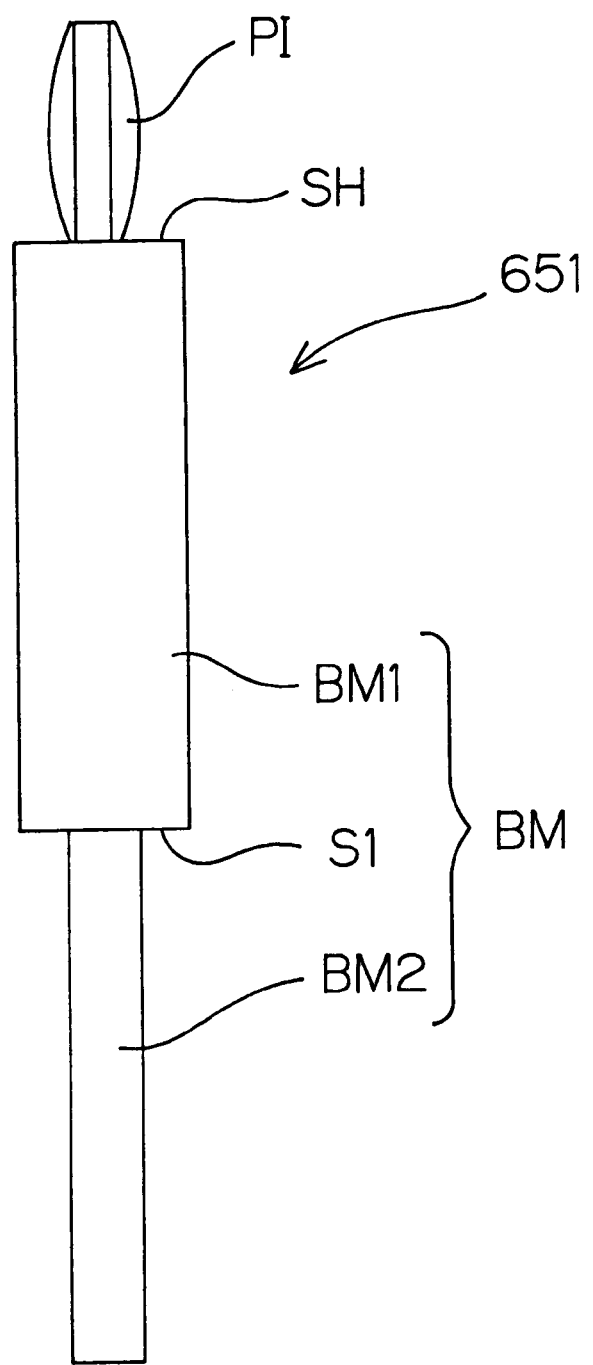
FIG. 9 is a front view for explaining the construction of a relay pin used in another embodiment of the present invention.

FIG. 9 is a schematic sectional view for explaining the construction of a relay pin 651 used in another embodiment of the present invention. In FIG. 9, portions of the pin corresponding to those illustrated in FIG. 7 are denoted by the same reference characters as in FIG. 7. The relay pin according to this embodiment does not include the second flange F2 provided in the aforesaid relay pin 65. Instead, the pin body BM of the relay pin 651 includes a large diameter cylindrical portion BM1 (thick pin portion) extending from the press-in portion P1 and a small diameter cylindrical portion BM2 (thin pin portion which is thinner than the large diameter cylindrical portion BM1) extending from the large diameter cylindrical portion BM1 toward the motherboard socket 31 with a step S1 being defined between the large diameter cylindrical portion BM1 and the small diameter cylindrical portion BM2. That is, the relay pin 651 is constructed as a stepped pin.

The large diameter cylindrical portion BM1 has a greater size than the corresponding pin insertion hole of the motherboard socket 31, and the small diameter cylindrical portion BM2 has a size that permits insertion thereof into the pin insertion hole of the motherboard socket 31. Therefore, the step S1 abuts against the surface of the motherboard socket 31 with the adapter 2 being attached to the motherboard socket 31. Thus, the step S1 has the same function as the second flange F2 of the relay pin 65 according to the first embodiment.

The large diameter cylindrical portion BM1 has a shoulder SH provided at its upper end in the vicinity of the press-in portion P1. The shoulder SH serves as an abutment support portion which abuts against a peripheral edge of the corresponding hole 25 of the printed wiring board 22 to support the printed wiring board 22, and has the same function as the first flange F1 of the relay pin 65 according to the first embodiment.

Figure 10:
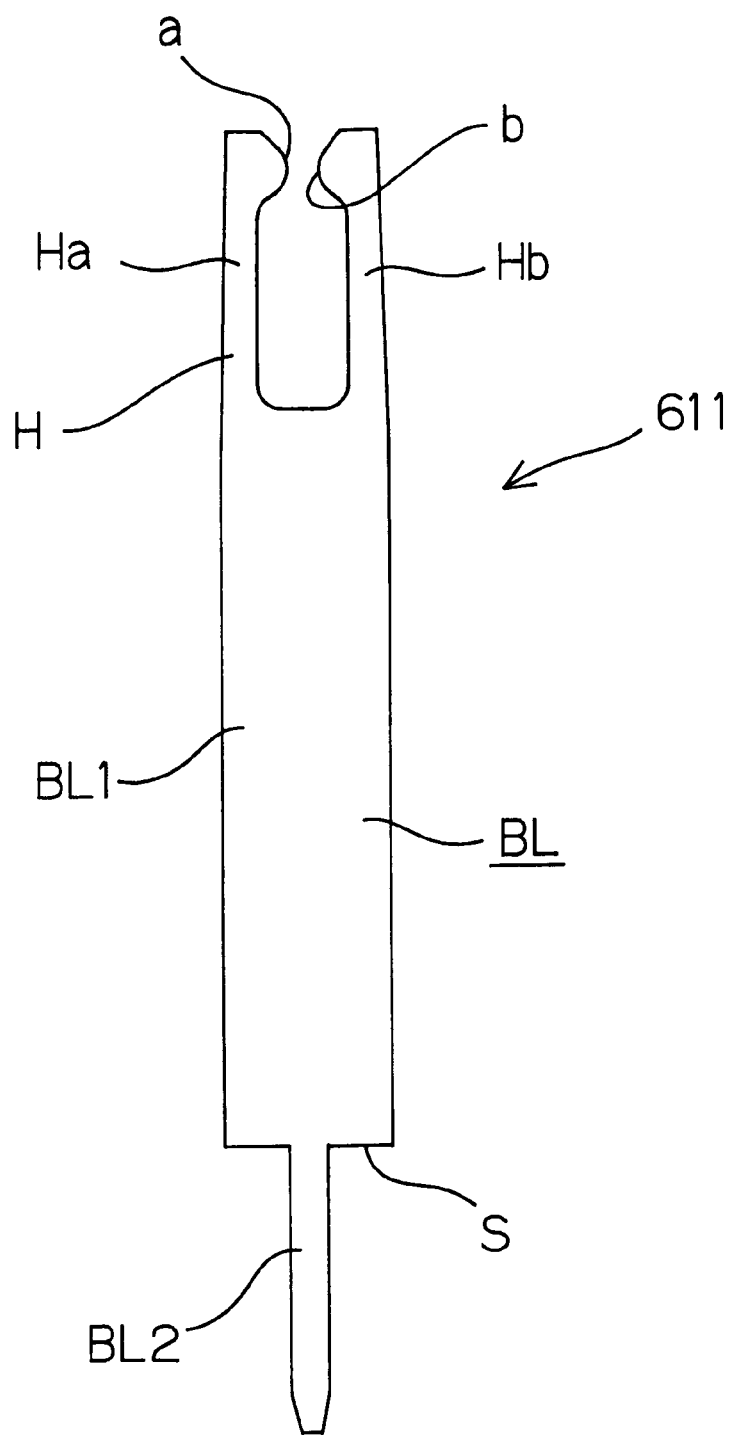
FIG. 10 is a front view illustrating the construction of a long insertion pin embodied as a stepped pin.
Figure 11:
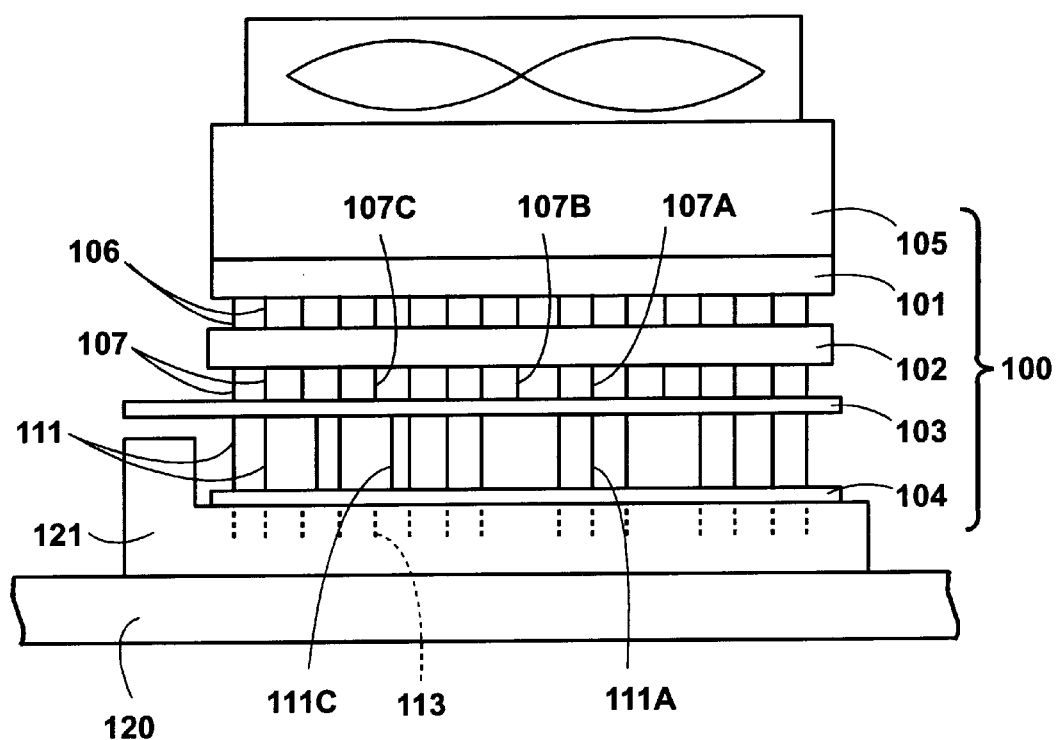
FIG. 11 is a schematic side view illustrating the construction of a conventional CPU accelerator.
Figure 12:
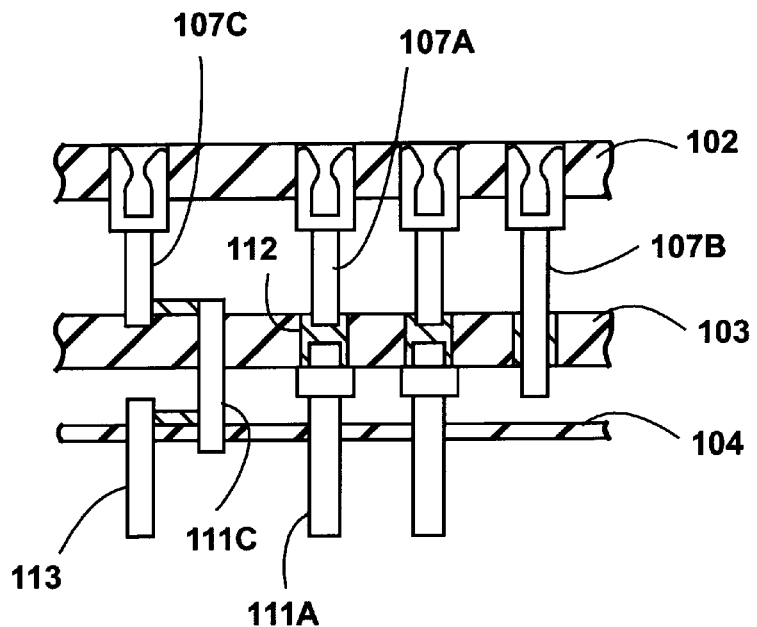
FIG. 12 is a sectional view illustrating the fitting of pins in accordance with the prior art.
Figure 13:
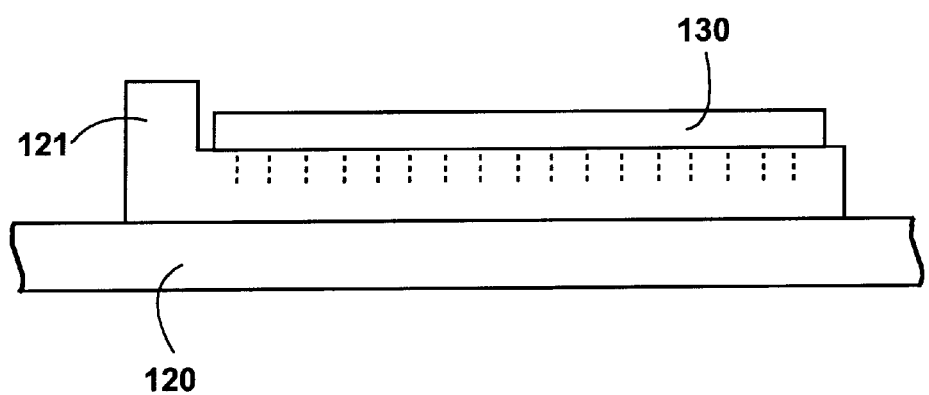
FIG. 13 is a schematic side view illustrating a CPU package attached to a socket of a motherboard.

Further, a stepped long insertion pin 611 as shown in FIG. 10 may be employed instead of the long insertion pin 61. The pin body BL of the long insertion pin 611 includes a great width portion BL1 of a plate shape extending from the pin holder H to reach the surface of the motherboard socket 31, and a small width portion BL2 of a generally cylindrical pin shape to be inserted into the corresponding pin insertion hole of the motherboard socket 31. The great width portion BL1 is a thick pin portion which has a great width that does not permit insertion thereof into the pin insertion hole of the motherboard socket 31, while the small width portion BL2 is a thin pin portion which is thinner than the thick pin portion. A step S defined between the great width portion BL1 and the small width portion BL2 abuts against the surface of the motherboard socket 31 for prevention of over-insertion of the long insertion pin 611.

This arrangement prevents almost all the pins from being over-inserted into the motherboard socket 31. Therefore, the slant insertion of the respective pins can assuredly be prevented, so that the adapter 2 can assuredly be attached to the motherboard socket 31 in a proper attitude.

While the two embodiments of the present invention have thus been described, the invention may be embodied in any other ways. Although the gate array 71 is provided on the printed wiring board 22 for signal adaptation to the motherboard of the personal computer of so-called PC-98 series in accordance with the aforesaid embodiments, the gate array 71 is not necessary for a CPU accelerator to be mounted on an IBM compatible personal computer. In such a CPU accelerator, the branch pins 61A are not necessarily present, so that all the long insertion pins 61 may be through-pins.

In the embodiments described above, the printed wiring board 22 is located at a level that prevents positional interference with the projection 31A of the motherboard socket 31. Alternatively, the interference of the printed wiring board 22 with the projection 31A as viewed in plan may be prevented by mounting the regulator IC 72, the power transistor 73 and the like, for example, in a region of the printed wiring board 22 extending apart from the projection 31A as indicated by a two-dot-and-dash line in FIG. 2. In this case, the printed wiring board 22 can be located closer to the surface of the motherboard socket 31, so that the height of the entire CPU accelerator 10 can be reduced. Unlike the prior art, a space occupied by the CPU accelerator 10 can effectively be reduced without the two intermediate printed wiring boards employed in the prior art.

However, large size components such as an electrolytic capacitor are mounted adjacent the motherboard socket 31 in some cases and, therefore, it is preferred to design the CPU accelerator so that the printed wiring board 22 can be accommodated in a space above the motherboard socket 31 for prevention of positional interference thereof with such components.

Although the pin holders H of the pins 60 of the PGA socket 21 are each adapted to hold the corresponding pin 11 of the PGA package 1 between the pair of arms Ha and Hb in the aforesaid embodiments, the PGA socket 21 may include, instead of the pins 60, pins each having a hollow cylindrical pin holder for receiving the distal end of the pin 11 of the PGA package 1.

Although the PGA package (CPU package) is employed as an exemplary integrated circuit in the embodiments described above, the invention can advantageously be applied to other various devices having similar constructions.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Application No. 10-374301 filed to the Japanese Patent Office on Dec. 28, 1998, the disclosure thereof being incorporated herein by reference.

What is claimed is:

1. A socket for an integrated circuit, which is used for attaching the integrated circuit to a socket mounted on a primary wiring board with an intermediate wiring board interposed therebetween, the integrated circuit socket comprising:
    a housing to be directly fitted with the integrated circuit;
    a long insertion pin which is to be inserted through the intermediate wiring board and to be fitted in the socket of the primary wiring board;
    a short insertion pin which is to be inserted through the intermediate wiring board but not to reach the socket of the primary wiring board; and
    a surface-mount pin which is to be connected to a surface of the intermediate wiring board on a side opposed to the housing;
    the long insertion pin, the short insertion pin and the surface-mount pin being implanted in the housing.

2. An integrated circuit socket as set forth in claim 1, wherein the long insertion pin includes a branch pin which is to be electrically connected to a circuit provided on the intermediate wiring board.

3. An integrated circuit socket as set forth in claim 1, wherein the long insertion pin includes a through-pin which is to be electrically isolated from a circuit provided on the intermediate wiring board.

4. An integrated circuit socket as set forth in claim 1, wherein the short insertion pin includes a pin which is to be electrically connected to a circuit provided on the intermediate wiring board and electrically isolated from the primary wiring board.

5. An integrated circuit socket as set forth in claim 1, wherein the surface-mount pin includes a pin which is to be electrically connected to a circuit provided on the intermediate wiring board.

6. An integrated circuit socket as set forth in claim 1, wherein the long insertion pin has an over-insertion preventing mechanism for restricting an insertion depth thereof with respect to the socket mounted on the primary wiring board.

7. An adapter for an integrated circuit, which is used for attaching the integrated circuit to a socket mounted on a primary wiring board, the integrated circuit adapter comprising:
- an intermediate wiring board which is to be interposed between the integrated circuit to be attached and the socket mounted on the primary wiring board; and
- an integrated circuit socket for attaching the integrated circuit to the socket mounted on the primary wiring board with the intermediate wiring board interposed therebetween, wherein the integrated circuit socket includes:
- a housing to be directly fitted with the integrated circuit;
- a long insertion pin extending through the intermediate wiring board to be fitted in the socket of the primary wiring board;
- a short insertion pin extending through the intermediate wiring board not to reach the socket of the primary wiring board; and
- a surface-mount pin connected to a surface of the intermediate wiring board on a side opposed to the housing;
- the long insertion pin, the short insertion pin and the surface-mount pin being implanted in the housing.

8. An integrated circuit adapter as set forth in claim 7, wherein the intermediate wiring board has a relay pin which is provided on a surface thereof to be opposed to the socket of the primary wiring board in association with the surface-mount pin, and is to be fitted in the socket of the primary wiring board.

9. An integrated circuit adapter as set forth in claim 8, wherein the relay pin includes a pin which is connected to a circuit provided on the intermediate wiring board.

10. An integrated circuit adapter as set forth in claim 8, wherein the relay pin has an over-insertion preventing mechanism for restricting an insertion depth thereof with respect to the socket mounted on the primary wiring board.

11. An integrated circuit assembly, which is attached to a socket mounted on a primary wiring board for use, the integrated circuit assembly comprising:
- an integrated circuit; and
- an integrated circuit adapter attached to the integrated circuit, wherein the integrated circuit adapter includes:
- an intermediate wiring board which is to be interposed between the attached integrated circuit and the socket mounted on the primary wiring board; and
- an integrated circuit socket for attaching the integrated circuit to the socket mounted on the primary wiring board with the intermediate wiring board interposed therebetween, wherein the integrated circuit socket includes:
- a housing directly fitted with the integrated circuit;
- a long insertion pin extending through the intermediate wiring board to be fitted in the socket of the primary wiring board;
- a short insertion pin extending through the intermediate wiring board not to reach the socket of the primary wiring board; and
- a surface-mount pin connected to a surface of the intermediate wiring board on a side opposed to the housing;
- the long insertion pin, the short insertion pin and the surface-mount pin being implanted in the housing.

12. An integrated circuit assembly as set forth in claim 11, which serves as a CPU accelerator, wherein the integrated circuit is a CPU package incorporating a CPU.

13. An integrated circuit assembly as set forth in claim 11, wherein the long insertion pin includes a signal pin for transmitting a signal as it is between the integrated circuit and the primary wiring board, wherein the short insertion pin includes a setting pin for applying a setting signal to the integrated circuit from the intermediate wiring board, wherein the surface-mount pin includes a pin which is to be connected to the primary wiring board via a conversion circuit provided on the intermediate wiring board.

\* \* \* \* \*

UNITED STATES PATENT AND TRADEMARK OFFICE
CERTIFICATE OF CORRECTION

PATENT NO. : 6,176,709 B1
DATED : January 23, 2001
INVENTOR(S) : Yoshiiku Sonobe et al.

It is certified that error appears in the above-identified patent and that said Letters Patent is hereby corrected as shown below:

<u>Title page,</u>
Item [54], title should read,-- [54] SOCKET AND ADAPTER FOR INTERGRATED CIRCUIT, AND INTERGRATED CIRCUIT ASSEMBLY.--

Signed and Sealed this

Sixteenth Day of October, 2001

Attest:

NICHOLAS P. GODICI
Attesting Officer
*Acting Director of the United States Patent and Trademark Office*